United States Patent
Yang

(10) Patent No.: US 7,471,523 B2
(45) Date of Patent: *Dec. 30, 2008

(54) METHOD AND APPARATUS FOR DETECTING DEMAGNETIZING TIME OF MAGNETIC DEVICE

(75) Inventor: Ta-yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 287 days.

This patent is subject to a terminal disclaimer.

(21) Appl. No.: 11/464,692

(22) Filed: Aug. 15, 2006

(65) Prior Publication Data

US 2008/0043503 A1  Feb. 21, 2008

(51) Int. Cl.
*H02M 3/335* (2006.01)
(52) U.S. Cl. ............... 363/21.13; 363/21.12; 363/21.17; 363/21.18; 363/97; 363/131
(58) Field of Classification Search .............. 363/21.12, 363/21.13, 21.16, 21.17, 21.18, 97, 131
See application file for complete search history.

(56) References Cited

U.S. PATENT DOCUMENTS

| | | | | |
|---|---|---|---|---|
| 5,901,051 | A | * | 5/1999 | Takahashi et al. ......... 363/21.18 |
| 5,903,452 | A | | 5/1999 | Yang |
| 7,016,204 | B2 | * | 3/2006 | Yang et al. ............... 363/21.13 |
| 7,054,170 | B2 | * | 5/2006 | Yang et al. ............... 363/21.18 |
| 7,061,780 | B2 | * | 6/2006 | Yang et al. ............... 363/21.16 |
| 7,259,972 | B2 | * | 8/2007 | Yang ....................... 363/21.16 |
| 7,349,229 | B1 | * | 3/2008 | Yang ....................... 363/21.16 |
| 7,352,595 | B2 | * | 4/2008 | Yang et al. ............... 363/21.13 |
| 7,362,592 | B2 | * | 4/2008 | Yang et al. ............... 363/21.13 |
| 7,362,593 | B2 | * | 4/2008 | Yang et al. ............... 363/21.16 |

* cited by examiner

*Primary Examiner*—Bao Q Vu
(74) *Attorney, Agent, or Firm*—J.C. Patents

(57) ABSTRACT

A detection circuit for detecting the demagnetizing time of a magnetic device is provided. An input circuit is coupled to the magnetic device for detecting a magnetizing voltage and a demagnetizing voltage of the magnetic device. A control circuit is coupled to the input circuit for generating a demagnetizing-time signal in response to the magnetizing voltage, the demagnetizing voltage, and a magnetizing time. The magnetizing time is correlated to the enable period of the magnetizing voltage. The demagnetizing time of the magnetic device is represented by the demagnetizing-time signal.

15 Claims, 4 Drawing Sheets

METHOD AND APPARATUS FOR DETECTING DEMAGNETIZING TIME OF MAGNETIC DEVICE

BACKGROUND OF THE INVENTION

Field of Invention

The present invention relates in general to a magnetic device, and more particularly, to the control of the magnetic device.

Magnetic devices are widely used in the power converters for providing energy storage, energy transfer, and/or signal filtering. The energy stored into the magnetic device must be discharged (demagnetized) before the next charging (magnetizing), otherwise magnetic saturation will occur. A charge current $I_C$ is flowed to the magnetic device when a voltage $V_C$ is applied to the magnetic device. A discharge current $I_D$ is flowed from the magnetic device in accordance with the voltage on the magnetic device $V_D$. $I_C$ and $I_D$ may be expressed as the following equations:

$$I_C = \frac{V_C}{L} \times T_{CHARGE} \quad (1)$$

$$I_D = \frac{V_D}{L} \times T_{DISCHARGE} \quad (2)$$

where L is the inductance of the magnetic device, $T_{CHARGE}$ is the charge time, and $T_{DISCHARGE}$ is the discharge time.

The charge current $I_C$ and the discharge current $I_D$ are shown in FIGS. 1 & 2. FIG. 1 shows the current of the magnetic device operating in a discontinuous current mode (DCM), in which the energy of the magnetic device is fully discharged before the next charging. FIG. 2 shows a continuous current mode (CCM) operation, in which the magnetic device still holds energy when the next charge cycle has started. The DCM and the CCM each causes a different behavior for the current loop for controlling power converters, such as described in "Adaptive slope compensator for current mode power converters" by Yang, U.S. Pat. No. 5,903,452. Therefore, the discharge time measurement of the magnetic device is an important factor for optimizing the control of the power converter. A common approach for detecting the discharge time is by sensing the switching current of the magnetic device using a current sensing device. However, the sensing of the switching current generates power losses and increases complexity for the detection circuit. An object of present invention is to provide a detection circuit of higher efficiency and of simpler design for measuring the discharge time of the magnetic device.

SUMMARY OF THE INVENTION

The present invention provides a method and apparatus to detect the discharge time of a magnetic device. It comprises an input circuit coupled to the magnetic device for detecting a first voltage and a second voltage of the magnetic device. The input circuit further generates a first signal, a second signal, and a charge-time signal, in response to the first voltage and the second voltage. The first voltage is the voltage applied to the magnetic device for charging the magnetic device. The second voltage is the voltage on the magnetic device during the discharge of the magnetic device. A control circuit is coupled to the input circuit for generating a discharge-time signal in response to the first signal, the second signal, and the charge-time signal. The first signal is correlated to the first voltage. The second signal is correlated to the second voltage. The charge-time signal is correlated to the enable period of the first voltage. The period of the discharge-time signal represents the discharge time of the magnetic device.

BRIEF DESCRIPTION OF ACCOMPANIED DRAWINGS

The accompanying drawings are included to provide a further understanding of the present invention, and are incorporated in and constitute a part of this specification. The drawings illustrate embodiments of the present invention and, together with the description, serve to explain the principles of the present invention. In the drawings, FIG. 1 shows a switching current of a magnetic device operating in a discontinuous current mode (DCM).

DESCRIPTION OF THE PREFERRED EMBODIMENT

Figure 1:
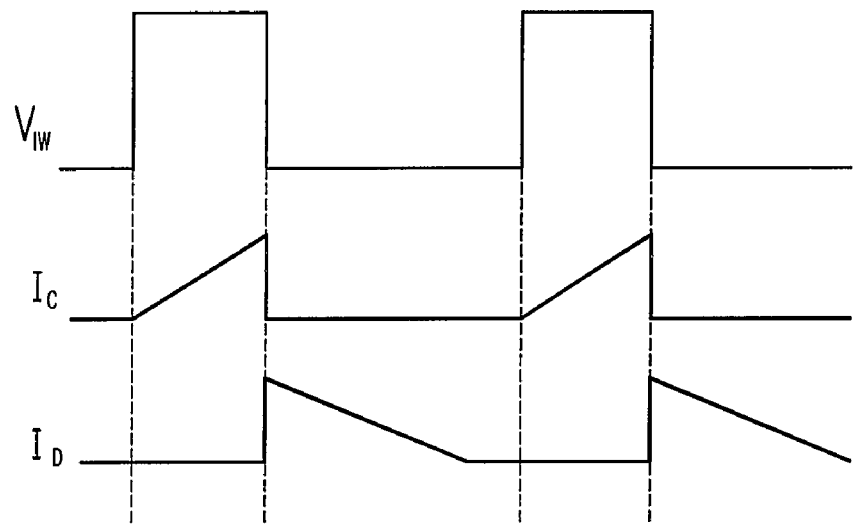
Figure 2:
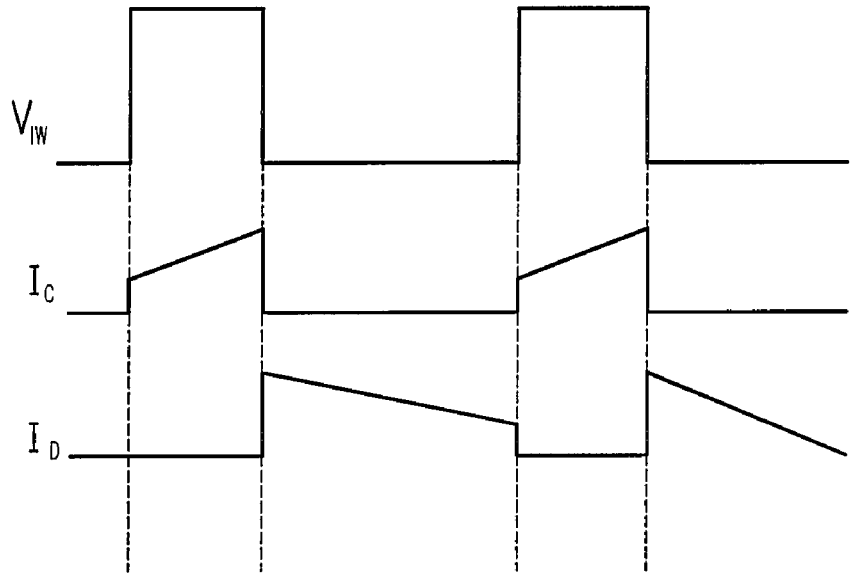
FIG. 2 shows a continuous current mode (CCM) operation of the magnetic device.
Figure 3:
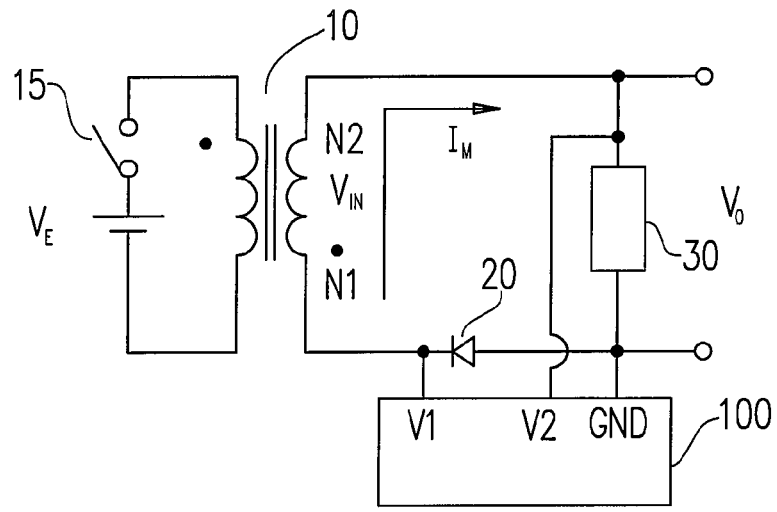
FIG. 3 illustrates a power converter having a detection circuit for detecting a demagnetizing time of a magnetic device, according to a preferred embodiment of the present invention.

FIG. 3 illustrates a power converter having a detection circuit 100 with a first voltage node V1, a second voltage node V2, and a ground node GND for detecting a discharge time of a magnetic device, according to a preferred embodiment of the present invention. The detection circuit 100 is coupled for detecting a plurality of voltages of a transformer 10. When a voltage source $V_E$ is applied to a primary winding of the transformer 10, a diode 20 is reverse biased, and the transformer 10 is charged. A voltage $V_{IN}$ is produced proportional to the voltage source $V_E$ at a secondary winding of the transformer 10 with a first node N1 and a second node N2. In addition, the first voltage node V1 of the detection circuit is connected to the first node N1 of the magnetic device such as the secondary winding of the transformer 10 and the second voltage node V2 of the detection circuit 100 is connected to the second node N2 of the magnetic device. A discharge current $I_M$ is generated to turn on the diode 20 once the switch 15 is turned off. Meanwhile, a voltage $V_O$ is added to the secondary winding of the transformer 10 when the discharge current $I_M$ is flowed into the load 30.

The boundary conditions of CCM and DCM are given by $$\Phi_C = \Phi_D \quad (3)$$

$$\Phi = B \times A = \frac{V \times T}{N} \quad (4)$$

-continued $$\frac{V_{IN}}{N} \times T_{CHARGE} = \frac{V_O}{N} \times T_{DISCHARGE} \quad (5)$$

$$V_{IN} \times T_{CHARGE} = V_O \times T_{DISCHARGE} \quad (6)$$

where $\Phi_C$ and $\Phi_D$ are a charge flux and a discharge flux of the magnetic device, respectively; B is the flux density; A is the cross-section area of the magnetic device; T is the magnetizing period; N is the winding turns of the magnetic device; $T_{CHARGE}$ and $T_{DISCHARGE}$ are the charge time (magnetizing time) and the discharge time (demagnetizing time), respectively.

The discharge time ($T_{DISCHARGE}$) of the transformer 10 can be obtained in accordance with the equation (7).

$$T_{DISCHARGE} = \frac{V_{IN}}{V_O} \times T_{CHARGE} \quad (7)$$

Equation (7) shows that the discharge time $T_{DISCHARGE}$ can be detected in accordance with the voltage $V_{IN}$, the voltage $V_O$, and the charge time $T_{CHARGE}$.

Figure 4:
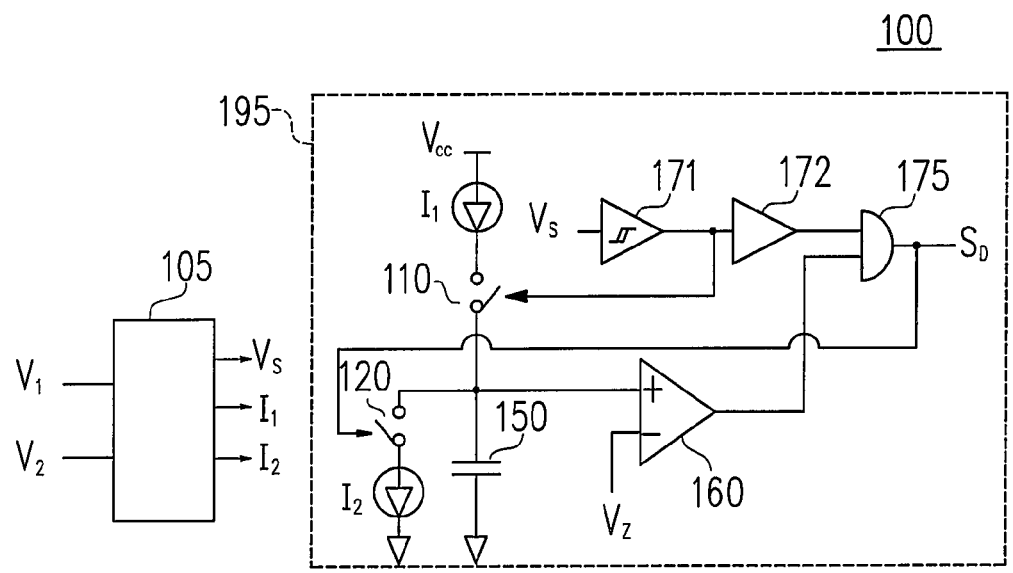
FIG. 4 shows a preferred embodiment of the detection circuit according to an embodiment of the present invention.

FIG. 4 shows the detection circuit 100 according to a preferred embodiment of the present invention. An input circuit 105 is coupled to the magnetic device (such as the transformer 10) to detect a first voltage $V_1$ and a second voltage $V_2$ for generating a first signal $I_1$, a second signal $I_2$, and a charge-time signal $V_S$ in response to the first voltage $V_1$ and the second voltage $V_2$. The first voltage $V_1$ is the voltage applied to the magnetic device (such as the voltage $V_{IN}$) for charging the magnetic device. The second voltage $V_2$ is the voltage on the magnetic device (such as the voltage $V_O$) during the discharge period of the magnetic device. The first voltage $V_1$ therefore represents a magnetizing voltage, and the second voltage $V_2$ represents a demagnetizing voltage.

A control circuit 195 is coupled to the input circuit 105 for generating a discharge-time signal $S_D$ in response to the first signal $I_1$, the second signal $I_2$ and the charge-time signal $V_S$. The first signal $I_1$ is correlated to the first voltage $V_1$. The second signal $I_2$ is correlated to the second voltage $V_2$. The charge-time signal $V_S$ is correlated to the enable period of the first voltage $V_1$. Therefore, the period of the discharge-time signal $S_D$ represents the discharge time of the magnetic device, in which the period of the discharge-time signal $S_D$ is increased in response to the increase of the first voltage $V_1$. The period of the discharge-time signal $S_D$ is decreased in response to the decrease of the period of the charge-time signal $V_S$. Furthermore, the period of the discharge-time signal $S_D$ is decreased in response to the increase of the second voltage $V_2$.

The control circuit 195 comprises a capacitor 150. A switch 110 is coupled in between the first signal $I_1$ and the capacitor 150. A switch 120 is coupled in between the second signal $I_2$ and the capacitor 150. A comparator 160 is coupled to the capacitor 150 to generate a switch signal once the voltage of the capacitor 150 is higher than a reference voltage $V_Z$. The switch signal is connected to an input of an AND gate 175. Another input of the AND gate 175 is coupled to the charge-time signal $V_S$ through an inverter 172 and a buffer circuit 171. The AND gate 175 is operated as an output circuit to generate the discharge-time signal $S_D$ in response to the switch signal and the disabling of the charge-time signal $V_S$. The switch 110 is turned on in response to the enabling of the charge-time signal $V_S$. The switch 120 is turned on in response to the enabling of the discharge-time signal $S_D$. The first signal $I_1$ is thus used for charging the capacitor 150, and the second signal $I_2$ is utilized for discharging the capacitor 150.

Figure 5:
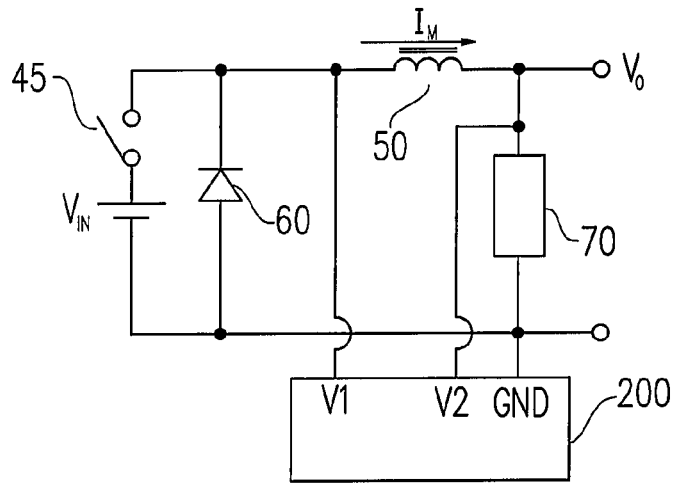
FIG. 5 shows a power converter having a detection circuit for the detection of a demagnetizing time of a magnetic device, according to another preferred embodiment of the present invention.

FIG. 5 shows another preferred embodiment of a power converter having a detection circuit 200 for detecting a demagnetizing time of a magnetic device. The detection circuit 200 is coupled for detecting voltages of an inductor 50. When a switch 45 is turned on, a diode 60 is turned off. A differential voltage ($V_{IN}-V_O$) is applied to charge the inductor 50 maybe at this moment. Once the switch 45 is turned off, a discharge current $I_M$ is circulated to the diode 60 and a load 70. Meanwhile, a voltage $V_O$ is added to the inductor 50.

The boundary conditions of CCM and DCM for the power converter shown in FIG. 5 is given by $$(V_{IN}-V_O) \times T_{CHARGE} = V_O \times T_{DISCHARGE} \quad (7)$$

$$T_{DISCHARGE} = \frac{(V_{IN} - V_O)}{V_O} \times T_{CHARGE} \quad (8)$$

The above equation (8) shows that the discharge time $T_{DISCHARGE}$ can be detected in accordance with the voltage $V_{IN}$, the voltage $V_O$, and the charge time $T_{CHARGE}$.

Figure 6:
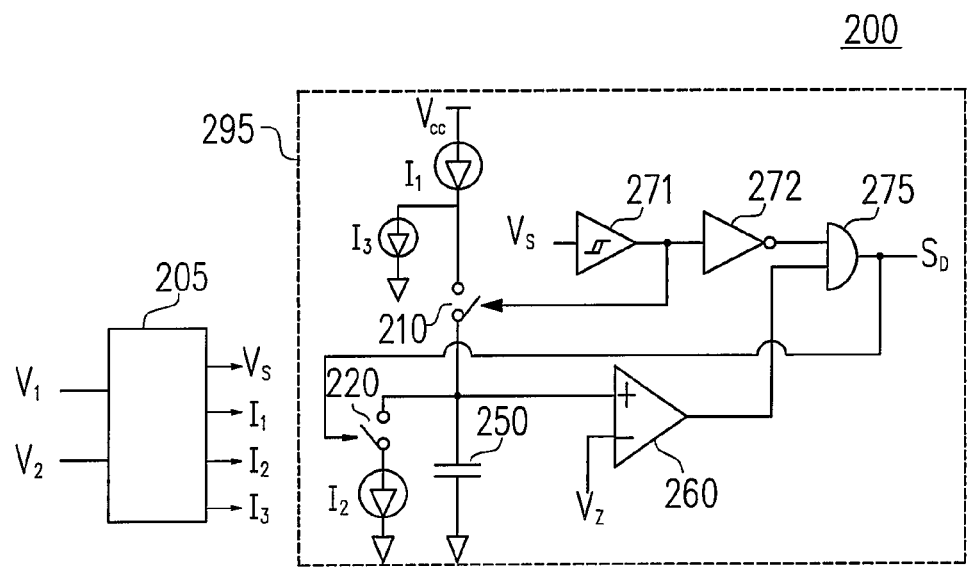
FIG. 6 shows the detection circuit, according to another preferred embodiment of the present invention.

FIG. 6 shows a preferred embodiment of the detection circuit 200. At least one ground node is shown in the detection circuit 200 in FIG. 6. An input circuit 205 is coupled to the magnetic device (the inductor 50) to detect the first voltage $V_1$ at the first voltage node V1 and the second voltage $V_2$ at the second voltage node V2 for generating the first signal $I_1$, the second signal $I_2$, a third signal $I_3$, and the charge-time signal $V_S$ in response to the first voltage $V_1$ and the second voltage $V_2$. A control circuit 295 is coupled to the input circuit 205 for generating the discharge-time signal $S_D$ in response to the first signal $I_1$, the second signal $I_2$, the third signal $I_3$, and the charge-time signal $V_S$. The third signal $I_3$ is correlated to the second voltage $V_2$. The control circuit 295 includes a capacitor 250. The first signal $I_1$ and the third signal $I_3$ are connected in serial. A switch 210 is coupled to the first signal $I_1$ and the third signal $I_3$. The switch 210 is further coupled to the capacitor 150. A switch 220 is connected in between the second signal $I_2$ and the capacitor 250. A comparator 260 is coupled to the capacitor 250 for generating an enable signal once the voltage of the capacitor 250 is higher than the reference voltage $V_Z$. The enable signal is connected to an input of an AND gate 275. Another input of the AND gate 275 is coupled to the charge-time signal $V_S$ through an inverter 272 and a buffer circuit 271. The AND gate 275 is operated as an output circuit for generating the discharge-time signal $S_D$ in response to the enable signal and the disable of the charge-time signal $V_S$. The switch 210 is turned on in response to the enabling of the charge-time signal $V_S$. The switch 220 is turned on in response to the enabling of the discharge-time signal $S_D$. The first signal $I_1$ subtracts the third signal $I_3$ to generate a differential signal for charging the capacitor 250. The second signal $I_2$ is coupled for discharging the capacitor 250.

Figure 7:
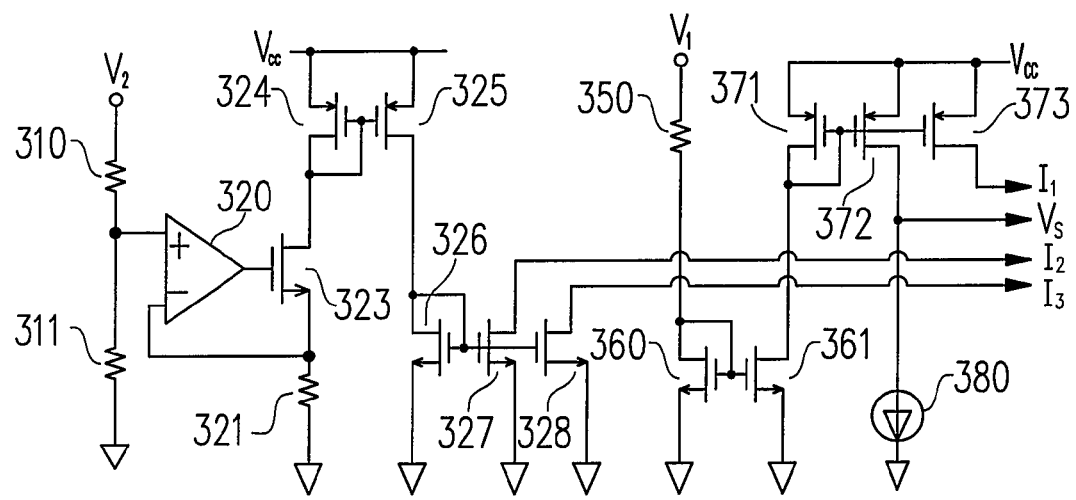
FIG. 7 shows an input circuit according to a preferred embodiment of the present invention.

FIG. 7 shows a preferred embodiment of the input circuit. It comprises a first circuit and a second circuit. A first resistive device 350 is coupled to detect the first voltage $V_1$ for generating a first current. A plurality of transistors 360, 361, 371, 372, 373 and a current source 380 form the first circuit. The transistor 360 is coupled to the first resistive device 350 to receive a current $I_{350}$. In accordance with the current $I_{350}$, the transistor 361 mirrors a current $I_{361}$ coupled to the transistor 371. The transistor 372 mirrors a current $I_{372}$ in response to the current $I_{361}$. Additionally, the transistor 373 generates the first signal $I_1$ in accordance with the current $I_{361}$. The current $I_{372}$ is connected to the current source 380 for generating the charge-time signal $V_S$ when the current $I_{372}$ is higher than the current of the current source 380. Therefore, the first signal $I_1$ is correlated to the first voltage $V_1$. The charge-time signal $V_S$ represents the enable period of the first voltage $V_1$.

An operational amplifier 320, a plurality of resistive devices 310, 311, 321, and a plurality of transistors 324, 325, 326, 327, 328 form the second circuit. The resistive devices 310 and 311 are coupled to detect the second voltage $V_2$. The input of the operational amplifier 320 is connected to the resistive devices 310 and 311. The operational amplifier 320, the resistive device 321, and the transistor 323 form a converter for generating a current $I_{323}$ in response to the second voltage $V_2$. The transistor 324 is coupled to receive the current $I_{323}$ and to mirror a current $I_{325}$ at the transistor 325. The transistors 326, 327, and 328 form a current mirror for generating the second signal $I_2$ and the third signal $I_3$ in accordance with the current $I_{325}$.

Therefore, the second signal $I_2$ and the third signal $I_3$ are correlated to the second voltage $V_2$.

The first voltage $V_1$ and the second voltage $V_2$ determine a charge current $I_C$ of the capacitor 250 in FIG. 6. The charge current $I_C$ can be expressed as, $$I_C = \left(k1 \times \frac{V1}{R_{350}}\right) - \left(k3 \times \frac{V2}{R_{321}}\right) \quad (9)$$

The second voltage $V_2$ determines a discharge current $I_D$ of the capacitor 250. It is shown as, $$I_D = k2 \times \frac{V2}{R_{321}} \quad (10)$$

The voltage on the capacitor 250 can be expressed as, $$V_H = \frac{I_C}{C} \times T_{ON} = \frac{\frac{k1 \times V1}{R_{350}} - \frac{k3 \times V2}{R_{321}}}{C} \times T_{ON} \quad (11)$$

where k1, k2 and k3 are constants such as the ratio of resistive devices and/or the gain of the current mirror; C is the capacitance of the capacitor 250; $T_{ON}$ is the charge time of the capacitor 250.

By selecting the values of $k1/R_{350}$, $k3/R_{321}$, and $k2/R_{321}$ as $1/R$, the equation (11) can be rewritten as, $$V_H = \frac{V1 - V2}{R \times C} \times T_{ON} \quad (12)$$

The discharge time $T_{OFF}$ of the capacitor 250 is given by, $$T_{OFF} = \frac{C \times V_H}{I_D} = \frac{C \times V_H}{\frac{V2}{R}} \quad (13)$$

According to equations (12) and (13), the discharge time $T_{OFF}$ of the capacitor 250 may be utilized as the discharge time $T_{DISCHARGE}$ of the inductor 50.

$$T_{OFF} = \frac{V1 - V2}{V2} \times T_{ON} \quad (14)$$

$$T_{DISCHARGE} = \frac{V1 - V2}{V2} \times T_{CHARGE} \quad (15)$$

where the first voltage $V_1$ is correlated to the voltage $V_{IN}$; and the second voltage $V_2$ is correlated to the voltage $V_O$.

Therefore, the enable period of the discharge-time signal $S_D$ is increased in response to the increase of the magnetizing voltage and the magnetizing period. Furthermore, the enable period of the discharge-time signal $S_D$ is decreased in response to the increase of the demagnetizing voltage.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A detection circuit for detecting the discharge time of a magnetic device, comprising:
   an input circuit coupled to the magnetic device to detect a first voltage and a second voltage of the magnetic device for generating a first signal, a second signal, and a charge-time signal in response to the first voltage and the second voltage, wherein the first voltage is applied to the magnetic device for charging the magnetic device, and the second voltage is applied on the magnetic device during the discharging of the magnetic device; and
   a control circuit coupled to the input circuit to generate a discharge-time signal in response to the first signal, the second signal, and the charge-time signal,
   wherein the first signal is correlated to the first voltage, the second signal is correlated to the second voltage, the charge-time signal is correlated to the enable period of the first voltage, and the period of the discharge-time signal represents the discharge time of the magnetic device.

2. The detection circuit for detecting the discharge time of the magnetic device as claimed in claim 1, wherein the period of the discharge-time signal is increased in response to the increase of the first voltage, the period of the discharge-time signal is decreased in response to the decrease of the period of the charge-time signal, and the period of the discharge-time signal is decreased in response to the increase of the second voltage.

3. The detection circuit for detecting the discharge time of the magnetic device as claimed in claim 1, wherein the input circuit comprising:
   a first resistive device coupled to detect the first voltage for generating a first current;
   a first circuit coupled to the first resistive device to generate the first signal and the charge-time signal in response to the first current; and
   a second circuit coupled for detecting the second voltage to produce a second current,
   wherein the second signal is generated in response to the second current.

4. The detection circuit for detecting the discharge time of the magnetic device as claimed in claim 1, wherein the control circuit, comprising:
   a capacitor;
   a first switch coupled in between the first signal and the capacitor;

a second switch coupled in between the second signal and the capacitor;

a comparator coupled to the capacitor to generate a switch signal once the voltage of the capacitor is higher than a reference voltage; and an output circuit coupled to generate the discharge-time signal in response to the switch signal and the disabling of the charge-time signal, wherein the first switch is turned on in response to the enabling of the charge-time signal, the second switch is turned on in response to the enabling of the discharge-time signal, the first signal is used for charging the capacitor, and the second signal is utilized for discharging the capacitor.

5. A detection circuit to detect the demagnetizing time of a magnetic device, comprising:

an input circuit coupled to the magnetic device for detecting a magnetizing voltage and a demagnetizing voltage of the magnetic device; and a control circuit coupled to the input circuit for generating a demagnetizing-time signal in response to the magnetizing voltage, the demagnetizing voltage, and a magnetizing time, wherein the magnetizing time is correlated to the enable period of the magnetizing voltage, and the demagnetizing-time signal represents the demagnetizing time of the magnetic device.

6. The detection circuit to detect the demagnetizing time of the magnetic device as claimed in claim 5, wherein the period of the demagnetizing-time signal is increased in response to the increase of the magnetizing voltage, the period of the demagnetizing-time signal is decreased in response to the decrease of the magnetizing time, and the period of the demagnetizing-time signal is decreased in response to the increase of the demagnetizing voltage.

7. The detection circuit to detect the demagnetizing time of the magnetic device as claimed in claim 5, wherein the input circuit, comprising:

a first circuit coupled to the magnetizing voltage for generating a first signal and a magnetizing-time signal in response to the magnetizing voltage, wherein the magnetizing-time signal represents the magnetizing time; and a second circuit coupled to the demagnetizing voltage for producing a second signal.

8. The detection circuit to detect the demagnetizing time of the magnetic device as claimed in claim 5, wherein the control circuit, comprising:

a capacitor;

a first switch coupled in between the first signal and the capacitor;

a second switch coupled in between the second signal and the capacitor;

a comparator coupled to the capacitor for generating a switch signal once the voltage of the capacitor is higher than a reference voltage; and an output circuit generating the demagnetizing-time signal in response to the switch signal and the disabling of the magnetizing-time signal, wherein the first switch is enabled in response to the enabling of the magnetizing-time signal, the second switch is enabled in response to the enabling of the demagnetizing-time signal, the first signal is used for charging the capacitor, and the second signal is utilized for discharging the capacitor.

9. An apparatus for detecting demagnetizing time of a magnetic device, comprising:

a voltage source;

a first switch connected to the voltage source;

a transformer, having a primary winding and a secondary winding with a first node and a second node, wherein the primary winding is connected to the first switch;

a detection circuit for detecting the demagnetizing time of the transformer, having a first voltage node, a second voltage node, and a ground node, wherein the first voltage node is connected to the first node of the secondary winding, the second voltage node is connected to the second node of the secondary winding, the ground node is connected to the ground, and the detection circuit further comprising:

an input circuit;

a control circuit coupled to the input circuit;

a diode connected to the first node of the secondary winding and the ground; and an output load connected to the second node of the secondary winding and the ground.

10. The apparatus according to claim 9, wherein the input circuit is coupled to receive a first voltage and a second voltage for obtaining a discharge time signal to generate a charge time signal, a first signal, and a second signal in response to the first voltage and the second voltage.

11. The apparatus according to claim 10, wherein the control circuit is coupled to receive the charge time signal, the first signal, and the second signal for generating a discharge time signal in response to the charge time signal, the first signal, and the second signal.

12. An apparatus for detecting demagnetizing time of a magnetic device, comprising:

a detection circuit, having a first voltage node, a second voltage node, and a ground node, wherein the first voltage node is connected to the first node of the magnetic device, the second voltage node is connected to the second node of the magnetic device, and the ground node is connected to the ground and the detection circuit further comprising an input circuit and a control circuit; and an output circuit connected to the second node of the magnetic device and the ground.

13. The apparatus according to claim 12, wherein the first node of the magnetic device is charged with a voltage, and the second node of the magnetic device is discharged with a voltage.

14. The apparatus according to claim 12, wherein the input circuit coupled to receive a first voltage and a second voltage for generating a charge time signal, a first signal, and a second signal in response to the first voltage and the second voltage.

15. The apparatus according to claim 14, wherein the control circuit coupled to receive the charge time signal, the first signal, and the second signal for generating a discharge time signal in response to the charge time signal, the first signal, and the second signal.

* * * * *